(12) United States Patent
Huang et al.

(10) Patent No.: US 8,860,026 B2
(45) Date of Patent: Oct. 14, 2014

(54) THIN FILM TRANSISTOR ARRAY AND METHOD FOR MANUFACTURING THE SAME

(75) Inventors: Yen-Heng Huang, Hsin-Chu (TW); Hui-Fen Lin, Hsin-Chu (TW); Chung-Kai Chen, Hsin-Chu (TW); Chia-Hui Pai, Hsin-Chu (TW); Guei-Bing Hong, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 335 days.

(21) Appl. No.: 12/648,127

(22) Filed: Dec. 28, 2009

(65) Prior Publication Data

US 2011/0001138 A1    Jan. 6, 2011

(30) Foreign Application Priority Data

Jul. 6, 2009  (TW) ................. 98122805 A

(51) Int. Cl.
*H01L 29/04*  (2006.01)
*H01L 27/12*  (2006.01)

(52) U.S. Cl.
CPC .................. *H01L 27/1214* (2013.01)
USPC ........................................................... 257/59

(58) Field of Classification Search
USPC ........................................................... 257/59
See application file for complete search history.

(56) References Cited

U.S. PATENT DOCUMENTS

| | | | |
|---|---|---|---|
| 6,183,917 B1 | 2/2001 | Sakamoto et al. | |
| 8,115,215 B2 | 2/2012 | Chang | |
| 2004/0150809 A1* | 8/2004 | Chang et al. | 355/77 |
| 2004/0183084 A1* | 9/2004 | Wachi | 257/98 |
| 2005/0117094 A1 | 6/2005 | Kim et al. | |
| 2008/0068540 A1* | 3/2008 | Kang et al. | 349/106 |
| 2008/0251790 A1 | 10/2008 | Cheng | |
| 2009/0263921 A1* | 10/2009 | Lee et al. | 438/29 |
| 2009/0302406 A1* | 12/2009 | Gambino et al. | 257/432 |
| 2009/0309102 A1* | 12/2009 | Kim et al. | 257/72 |

FOREIGN PATENT DOCUMENTS

| | | |
|---|---|---|
| CN | 1624552 A | 6/2005 |
| CN | 101034222 A | 9/2007 |
| CN | 101047194 A | 10/2007 |

(Continued)

OTHER PUBLICATIONS

English language translation of abstract of JP 2006215226 (published Aug. 17, 2006).

(Continued)

*Primary Examiner* — Shaun Campbell
(74) *Attorney, Agent, or Firm* — McClure, Qualey & Rodack, LLP

(57) ABSTRACT

A thin film transistor (TFT) array includes a substrate, a thin film transistor, a first wall, a transparent electrode and a color resist. The thin film transistor is disposed on the substrate. The first wall is disposed on the substrate and separates a first contact hole from a pixel region on the substrate, wherein the first contact hole exposes a drain electrode of the thin film transistor. The first wall has a first sidewall facing towards the first contact hole and a second sidewall facing towards the pixel region, wherein the slope of the first sidewall is gentler than the slope of the second sidewall. The transparent electrode is electrically connected to the drain electrode of the thin film transistor through the first contact hole. The pixel region is filled with the color resist.

20 Claims, 10 Drawing Sheets

(56) References Cited

FOREIGN PATENT DOCUMENTS

| | | | |
|---|---|---|---|
| JP | 2005014043 A | 1/2005 |
| JP | 2006215226 | 8/2006 |
| TW | 200632560 A | 9/2006 |
| TW | 200841104 A | 10/2008 |
| TW | 200910021 A | 3/2009 |

OTHER PUBLICATIONS

English language translation of abstract of CN 101034222A (published Sep. 12, 2007).

English language translation of abstract of CN 101047194A (published Oct. 3, 2007).

English language translation of abstract of CN 1624552A (published Jun. 8, 2005).

English language translation of abstract of JP 2005014043A (published Jan. 20, 2005).

English language translation of abstract and pertinent parts of TW 200841104A (published Oct. 16, 2008).

English language translation of abstract and pertinent parts of TW 200910021 A (published Mar. 1, 2009).

English language translation of abstract and pertinent parts of TW 200632560 A (published Sep. 16, 2009).

* cited by examiner

THIN FILM TRANSISTOR ARRAY AND METHOD FOR MANUFACTURING THE SAME

RELATED APPLICATIONS

The present application is based on, and claims priority from, Taiwan Application Serial Number 98122805, filed Jul. 6, 2009, the disclosure of which is hereby incorporated by reference herein in its entirety.

BACKGROUND

1. Field of Invention

The present invention relates to a display apparatus. More particularly, the present invention relates to a liquid crystal display (LCD).

2. Description of Related Art

With respect to a LCD, an aperture ratio of its pixel region directly affects the utilization rate of a backlight module, and also affects the display brightness of the LCD. One of the major factors affecting the aperture ratio is the area of a wall formed on a substrate of the LCD. Therefore, for increasing the aperture ratio, various techniques have been developed, such as COA (Color Filter ON Array), UHA (Ultra High Aperture) and IJP-COA (Ink-Jet Printing-Color Filter On Array), so as to reduce the areas of the walls.

With respect to the IJP-COA technique, a pixel region and a contact hole is divided by means of a wall of which the sidewalls have the same slopes. However, the wall having the same sidewall slopes causes a color resist overflowing out of the pixel region, thus causing a yield problem, further resulting in a broken wire problem when a transparent electrode covers the contact hole.

SUMMARY

Hence, an aspect of the present invention is to provide a thin film transistor (TFT) array in which a wall has at least two different sidewall slopes for meeting different requirements of a contact hole and a pixel region.

In accordance with one embodiment of the present invention, a TFT array includes a substrate, a thin film transistor, a first wall, a transparent electrode and a color resist. The thin film transistor is disposed on the substrate. The first wall is disposed on the substrate and separates a first contact hole from a pixel region on the substrate, wherein the first contact hole exposes a drain electrode of the thin film transistor. The first wall has a first sidewall facing towards the first contact hole and a second sidewall facing towards the pixel region, wherein the slope of the first sidewall is gentler than the slope of the second sidewall. The transparent electrode is electrically connected to the drain electrode of the thin film transistor through the first contact hole. The pixel region is filled with the color resist.

Another aspect of the present invention is to provide a method for manufacturing the aforementioned TFT array.

In accordance with another embodiment of the present invention, the method for manufacturing the TFT array includes the following steps of:

(1) forming at least one thin film transistor on a substrate;

(2) forming a wall to cover the thin film transistor and the substrate;

(3) patterning the wall by using a photomask, thereby separating a contact hole from a pixel region by using the wall; and (4) moving the photomask relative to the substrate in a horizontal direction when the wall is being patterned, thereby forming the contact hole of which a sidewall slope is gentler than that of the pixel region.

In accordance with another embodiment of the present invention, the method for manufacturing the TFT array includes the following steps of:

(1) forming at least one thin film transistor on a substrate;

(2) forming a wall to cover the thin film transistor and the substrate; and (3) patterning the wall by using a gray-tone mask (GTM) or a half-tone mask (HTM), thereby separating a contact hole from a pixel region by using the wall, wherein a first sidewall of the contact hole has a gentler slope than a second sidewall of the pixel region.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
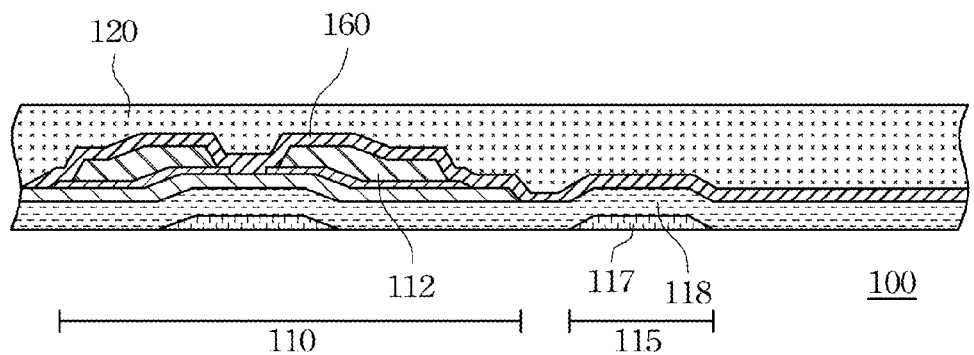
FIG. 1 to FIG. 6 are cross-sectional schematic views showing a flow process for manufacturing a TFT array according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 to FIG. 6 are cross-sectional views showing a flow process for manufacturing a TFT array according to one embodiment of the present invention. It should be understood that the steps disclosed in the present embodiment can be arranged in different sequences in accordance with actual needs besides the sequence those steps those whose sequences have been particularly specified, wherein all or part of the steps can be performed simultaneously.

Referring to FIG. 1, at least one TFT 110, and a lower electrode 117 and a dielectric layer 118 of a capacitor 115 are first formed on a substrate 100. Then, in accordance with situation requirements, a first protection layer 160 may be formed on the entire substrate 100, thereby protecting the TFT 110 from being affected by subsequent processes. It should be understood that the first protection layer is not a necessary element, and one of ordinary skill in the art may flexibly choose whether the first protection layer 116 should be formed in accordance with actual needs.

Thereafter, a wall 120 is formed on the substrate 110 to cover the TFT 110, the dielectric layer 118 of the capacitor 115, and the substrate 100, wherein the material forming the wall 120 can be varied in accordance with the requirements, and can be optionally an organic or inorganic material with ink repellent (herein called hydrophobic or lipophilic) properties, and also can be a conductor or non-conductor.

Figure 2:
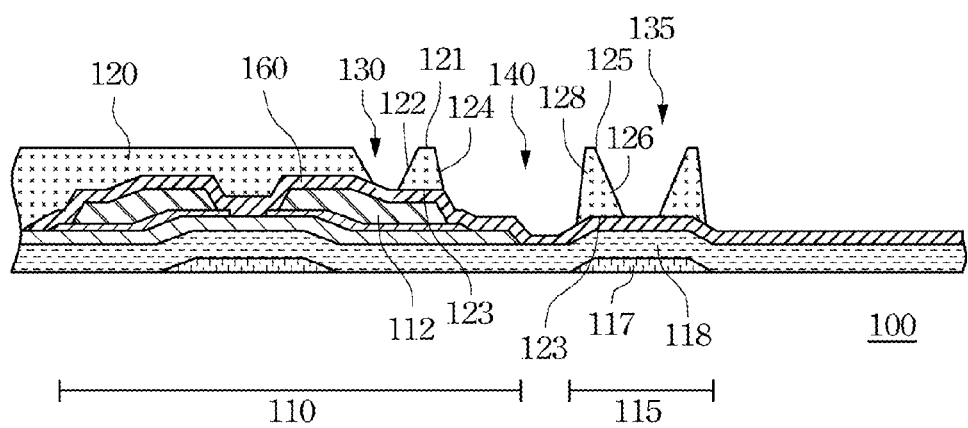
Figure 3:
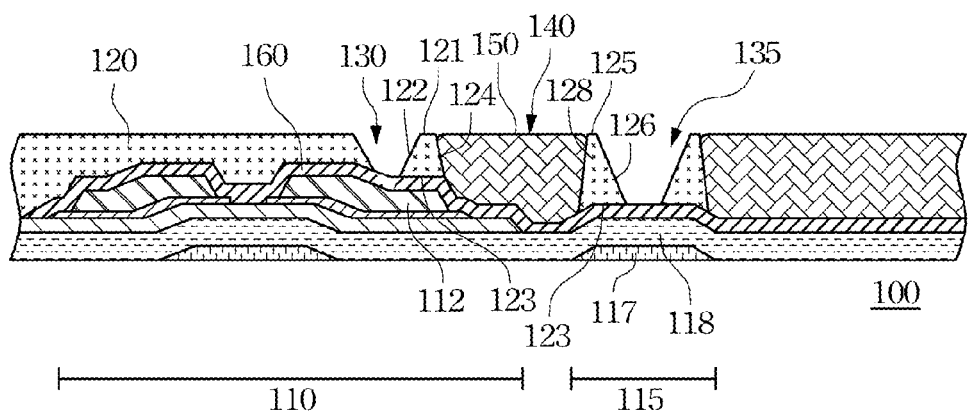

Referring to FIG. 2, the wall 120 is patterned by using a photomask, thereby forming a first contact hole 130, a second contact hole 135 and a pixel region 140 on the wall 120. In other words, after the wall 120 is patterned, at least one first wall 121 and at least one second wall 125 are formed on the substrate 100, wherein the first wall 121 separates the first contact hole 130 from the pixel region 140, and the second wall 125 separates the pixel region 140 from the second contact hole 135.

Since the contact holes and the pixel regions require different sidewall slopes, in the present step, the exposure amounts at the contact holes and the pixel region can be controlled to make the sidewall slopes of the contact holes gentler than the sidewall slope of the pixel region. Using the first wall 121 shown in FIG. 2 as an example, the first wall 121 includes a first sidewall 122 facing towards the first contact hole 130; and a second sidewall 124 facing towards the pixel region 140, wherein the slope of the first sidewall 122 is gentler than the slope of the second sidewall 124. Similarly, with respect to the second sidewall 125, the second sidewall 125 also includes a first sidewall 126 facing towards the second contact hole 135; and a second sidewall 128 facing towards the pixel region 140, wherein the slope of the first sidewall 126 is gentler than the slope of the second sidewall 128.

Figure 7:
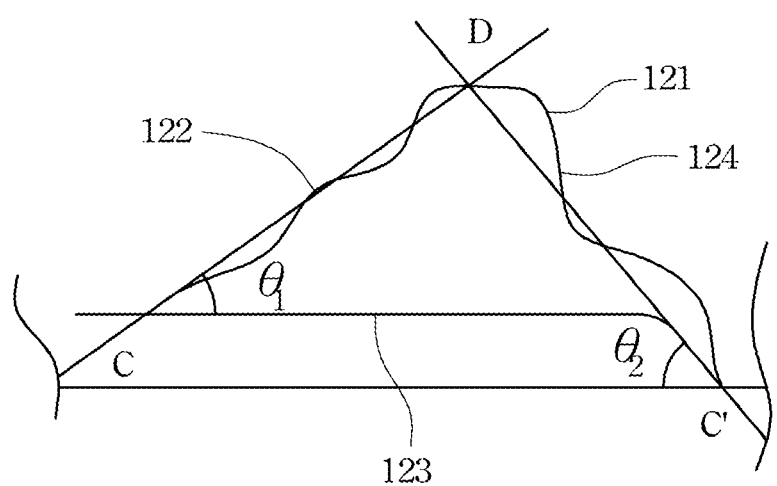
FIG. 7 is an enlarged schematic view of the wall shown in FIG. 2.

Detailedly speaking, each of the slopes of the first wall 121 and the second wall 125 is defined as an angle included between a horizontal line of a base 123 and a straight line formed by connecting a corner of a sidewall at the base 123 and a top point of the sidewall. Using the first wall 121 shown in FIG. 7, the corners C and C' of the sidewalls at the base 123 are respectively connected to the top point D of the sidewalls 122 and 124 to form straight lines CD and C'D, and two angles $\theta_1$ and $\theta_2$ are included between the respective straight lines CD and C'D and the horizontal line of the base 123, as shown in FIG. 7, thereby determining the difference between the slope of the first sidewall 122 and the slope of the second sidewall 124. If the angle $\theta_1$ is smaller than the angle $\theta_2$, then the slope of the first sidewall 122 is gentler than the slope of the second sidewall 124. Further, the slopes of the respective straight lines CD and C'D can be directly calculated to determine if the gradients of the sidewalls 122 and 124 are steep or gentle.

FIG. 8 to FIG. 12 are used as examples for explaining how to control the exposure amounts at the contact holes and the pixel region to make the sidewall slopes of the contact holes gentler than the sidewall slopes of the pixel region. It should be understood that, in the embodiments of the present invention, each of the walls can be formed from a negative photoresist, a positive photoresist or another photosensitive material, and also can be formed from an organic, inorganic, conductive or non-conductive material, and yet the embodiments of the present invention are not limited thereto. Hereinafter, a negative photoresist is used as an example for specifically explaining the implementation of the embodiments of the present invention.

Figure 8A:
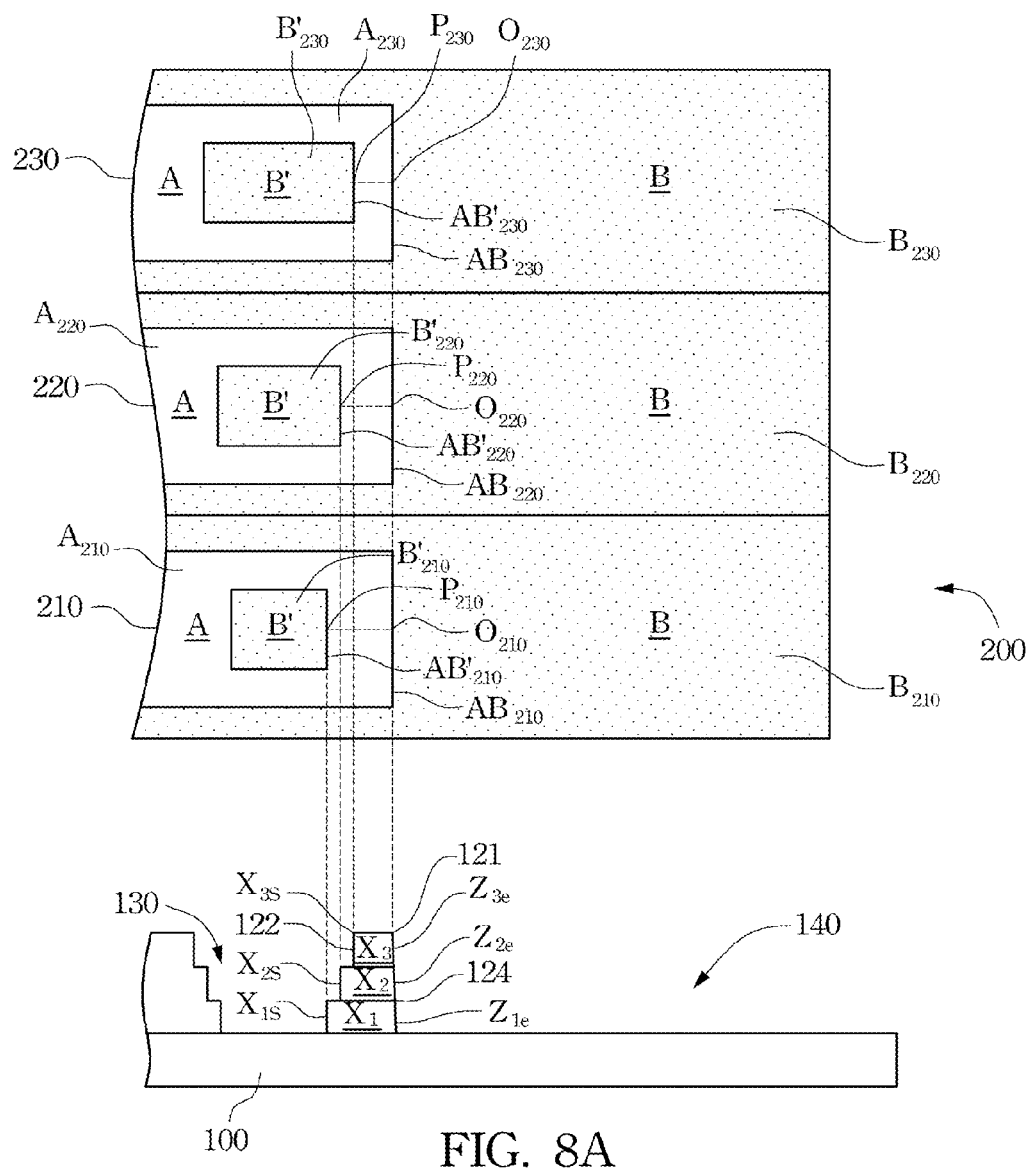
FIG. 8A to FIG. 8B are schematic views showing a patterning step according to one embodiment of the present invention.
Figure 8B:
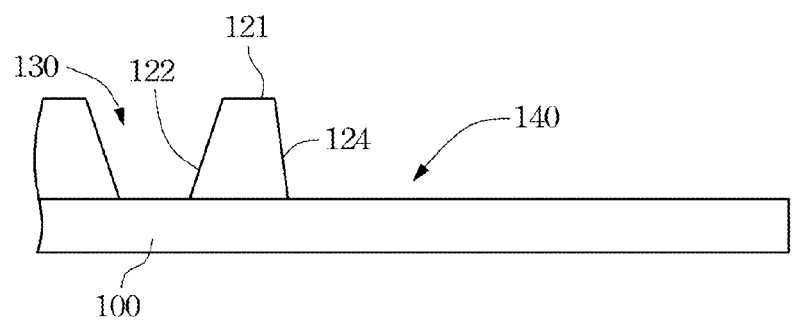

Please refer to FIG. 8A and FIG. 8B. While the walls are patterned, a photomask 200 can be moved relative to the substrate 100 in a horizontal direction. The relative movement called herein can be: fixing the position of the photomask 200 and moving the substrate 100; or fixing the position of the substrate 100 and moving the photomask 200; or relatively moving both of the substrate 100 and the photomask 200. One of ordinary skill in the art should flexibly choose the method for implementing the present step in accordance with actual needs. The photomask 200 includes patterns 210, 220 and 230. Each of the patterns 210, 220 and 230 includes a totally transparent zone A and totally light-blocking zones B and B', wherein the totally light-blocking zone B' is formed as a rectangle, and the totally transparent zone A is formed as a rectangular loop surrounding the totally light-blocking zone B', and the totally light-blocking zone B is formed as another rectangular loop surrounding the totally transparent zone A. The differences among the patterns 210, 220 and 230 reside in that: the area of the totally transparent zone A protruding from the totally light-blocking zone B' in the pattern 210 is greater in area than that in the pattern 220; and the area of the totally transparent zone A protruding from the totally light-blocking zone B' in the pattern 220 is greater than that in the pattern 230. For example, the distance in the pattern 210 between an end point $O_{210}$ (at the intersection of the zone $A_{210}$ and the zone $B_{210}$) and a horizontal point $P_{210}$ (at the intersection of the zone $A_{210}$ and the zone $B'_{210}$) is greater than the distance in the pattern 220 between an end point $O_{220}$ (at the intersection of the zone $A_{220}$ and the zone $B_{220}$) and a horizontal point $P_{220}$ (at the intersection of the zone $A_{220}$ and the zone $B'_{220}$); and the distance in the pattern 220 between an end point $O_{220}$ (at the intersection of the zone $A_{220}$ and the zone $B_{220}$) and a horizontal point $P_{220}$ (at the intersection of the zone $A_{220}$ and the zone $B'_{220}$) is greater than the distance in the pattern 230 between an end point $O_{230}$ (at the intersection of the zone $A_{230}$ and the zone $B_{230}$) and a horizontal point $P_{230}$ (at the intersection of the zone $A_{230}$ and the zone $B'_{230}$). Further, the area of the zone $B'_{230}$ of the pattern 230 is greater than the area of the zone $B'_{220}$ of the pattern 220, and the area of the zone $B'_{220}$ of the pattern 220 is greater than the area of the zone $B'_{210}$ of the pattern 210.

Please refer to FIG. 8A and FIG. 8B for explaining an exposure method of horizontally moving the photomask 200 on which the patterns 210, 220 and 230 with different exposure amounts at their respective zones A, B and B' are formed. A three-step stair structure shown in FIG. 8A formed by photoresist exposure is used as an example herein. The photomask 200 and the substrate 100 are disposed in parallel in a top and bottom arrangement, wherein the photomask 200 are disposed above the substrate 100. In the present embodiment, an exposure light source (not shown) is disposed above the photomask 200, and the first wall 121 is formed on the substrate 100. Then, an exposure step is performed on the first wall 121 by using the pattern 210 of the photomask 200. After the projection of the pattern 210 along a border $AB'_{210}$ between the zone $A_{210}$ and the zone $B'_{210}$ is aligned with a predetermined start line $X_{1s}$ of a first step $X_1$ of the first wall 121; and the projection of the pattern 210 along a border $AB_{210}$ between the zone $A_{210}$ and the zone $B_{210}$ is aligned with a predetermined end line $Z_{1e}$ of the first step $X_1$ of the first wall 121, a first exposure process is performed. Thereafter, the photomask 200 is moved horizontally at a speed until the projection of the pattern 220 along a border $AB'_{220}$ between the zone $A_{220}$ and the zone $B'_{220}$ is aligned with a predetermined start line $X_{2s}$ of a second step $X_2$ of the first wall 121; and the projection of the pattern 220 along a border $AB_{220}$ between the zone $A_{220}$ and the zone $B_{220}$ is aligned with a predetermined end line $Z_{2e}$ of the second step $X_2$ of the first wall 121, and then a second exposure step is performed. Thereafter, the photomask 200 is continued to be moved horizontally at a speed until the projection of the pattern 230 along a border $AB'_{230}$ between the zone $A_{230}$ and the zone $B'_{230}$ is aligned with a predetermined start line $X_{3s}$ of a third step $X_3$ of the first wall 121; and the projection of the pattern 230 along a border $AB_{230}$ between the zone $A_{230}$ and the zone $B_{230}$ is aligned with a predetermined end line $Z_{3e}$ of the second step $X_3$ of the first wall 121, and then a third exposure step is performed. Thereafter, a development process is performed. Using a negative photoresist as an example, when the negative photoresist undergoes exposure, cross-linking phenomena will be caused to prevent the negative photoresist from being affecting by a developer in a subsequent process, thus retaining the negative photoresist. However, if the negative photoresist does not undergo exposure, no cross-linking phenomena will be caused, and thus the negative photoresist will disappear due to the function of the developer. Therefore, after the development process, the pattern as shown in FIG. 8A is obtained, wherein the first sidewall 122 of the first wall 121 receives the influences of different exposure amounts, and shows the stair structure since portions of the photoresist are washed away by the developer. However, since the second sidewall 124 of the first wall 121 and the pixel region 140 are aligned with the totally light-blocking zone B, the photoresist corresponding thereto is not affected by exposure and is entirely washed away by the developer, so that the photoresist in the pixel region 140 cannot be retained. Thereafter, a baking process is performed to reflow the photoresist, thereby forming the first sidewall 122 and the second sidewall 124 shown in FIG. 8B. It is noted that the projections of the predetermined end line $Z_{2e}$ of the second step $X_2$ and that of the predetermined end line $Z_{3e}$ of the second step $X_3$ both fall on the predetermined end line $Z_{1e}$ of the first step $X_1$, but the embodiments of the present invention are not limited thereto. In other embodiments, different deigns can be used in accordance with different requirements. For example, the lines $Z_{1e}$, $Z_{2e}$ and $Z_{3e}$ are not overlapped together, or after development the pattern shows a stair structure with more than three steps or less than three steps.

Through the above processes, the slope of the first sidewall 122 in the contact hole 130 is gentler than that of the second sidewall 124 at the pixel region 140. The present embodiment also can use three photomasks individually for the respective patterns 210, 220 and 230, and also can adopt other patterns, such as polygons, circulars or irregular patterns, etc., but the embodiments of the present invention are not limited thereto.

The relative moving speed between the photomask 200 and the substrate 110 depends on actual requirements. In the present embodiment, the relative moving speed is ranged between 50 mm/sec and 300 mm/sec. It should be understood that the aforementioned process parameters are merely shown as examples for explanation, which are not used to limit the embodiments of the present invention. One of ordinary skill in the art should flexibly choose the appropriate ones in accordance with actual requirements.

Since the photomask 200 is moved relative to the substrate 100 in a horizontal direction during the exposure process, the patterns defining the wall are sequentially changed as shown by the pattern 210, the pattern 220 and the pattern 230. Consequently, after exposure, the wall can provide the sidewalls with two different slopes. For example, after exposure, the slope of the first sidewall 122 of the first wall 121 is gentler than that of the second sidewall 124 thereof. Detailedly speaking, using a negative photoresist as an example for explanation, when the negative photoresist undergoes exposure, cross-linking phenomena will be caused to prevent the negative photoresist from being affecting by a developer in a subsequent process, thus retaining the negative photoresist. However, if the negative photoresist does not undergo exposure, no cross-linking phenomena will be caused, and thus the negative photoresist will disappear due to the function of the developer. Thus, after exposure, the wall can provide the sidewalls with two different slopes. For example, after exposure, the first sidewall 122 of the first wall 121 receives the influences of different exposure amounts A and B', and thus portions of the negative photoresist corresponding thereto do not undergo exposure and will be washed away by a developer. On the other hand, the second sidewall 124 of the first wall 121 receives the influence of one single exposure amount B, and all of the negative photoresist corresponding thereto does not undergo exposure and thus will be washed away by the developer since no cross-line phenomena is caused. Consequently, a phenomena can be obtained that the slope of the first sidewall 122 of the first wall 121 is gentler than that of the second sidewall 124 thereof.

Figure 9A:
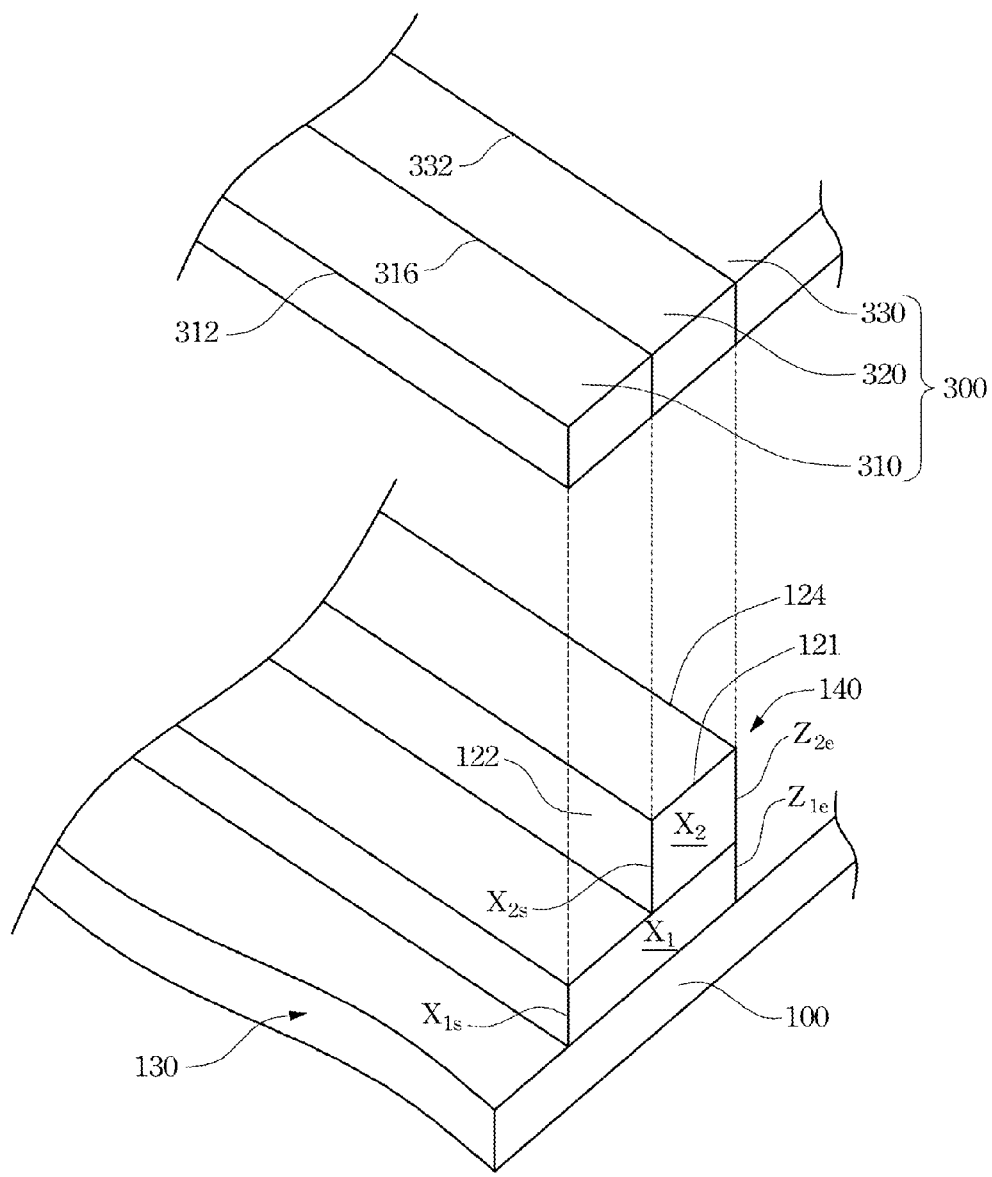
FIG. 9A to FIG. 9C are schematic views showing a patterning step according to another embodiment of the present invention.
Figure 9B:
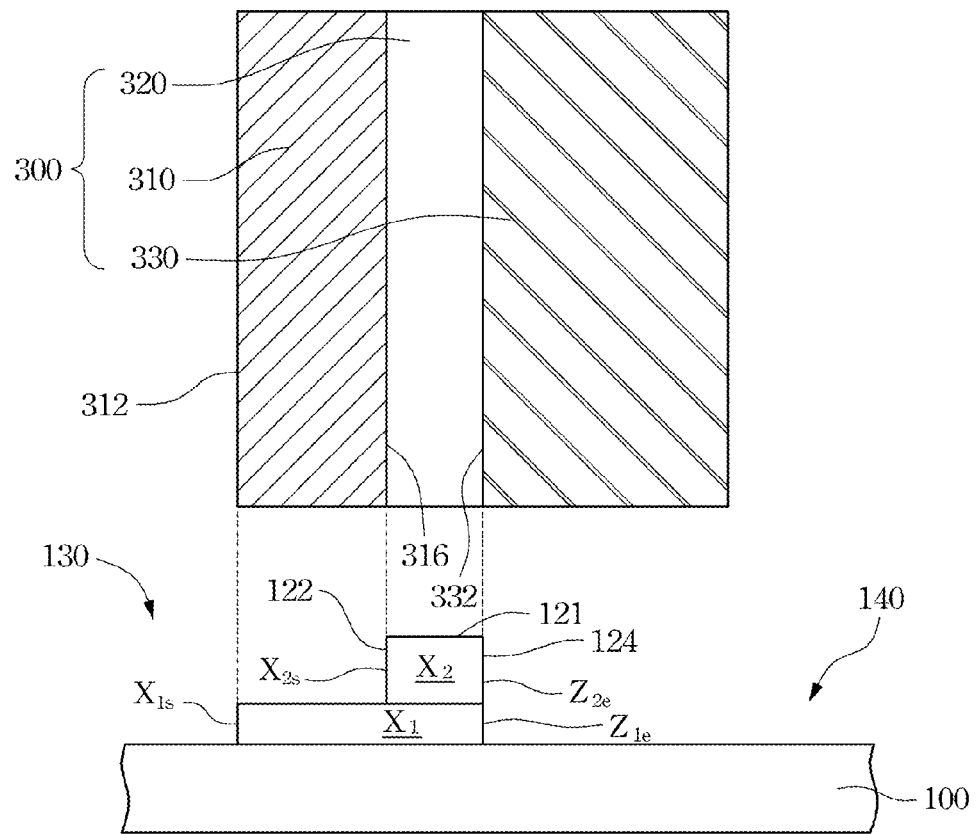
Figure 9C:
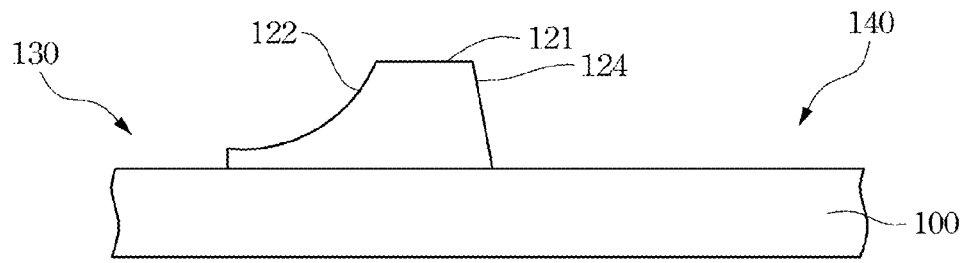

Further, at least one gray-tone mask (GTM) also can be disposed on the photomask in accordance with the situation, thereby further adjusting the exposure amounts on both sidewalls of the wall. For example, at the totally transparent zone A of the photomask shown in FIG. 8A, a GTM or half-tone mask (HTM) can be optionally adopted. For example, as shown in FIG. 9A to FIG. 9C, with respect to the first wall 121, at least one GTM pattern zone 310 can be disposed on the photomask. Thus, after exposure and development, since the first wall 121 receives the influences of different exposure amounts, the slope of the first sidewall 122 of the first wall 121 is gentler than that of the second sidewall 124 thereof.

It should be understood that FIG. 9A is a 3-D schematic diagram exemplarily showing the photomask and the substrate during actual exposure. In other embodiments, the photomask and the substrate are shown in top and side views (such as FIG. 8A, FIG. 9B, FIG. 10A and FIG. 11A), so as to clearly depict the relative positions of the photomask and the substrate.

Using a two-step stair structure formed by the photoresist after exposure as an example, a photomask 300 shown in FIG. 9B may include a GTM pattern zone 310, a totally transparent zone 320 and a totally light-blocking zone 330 arranged in sequence. A light transmittance of the GTM pattern zone 310 can be ranged between 10% and 80% or preferably between 30% and 50%, for example. The light transmittance of the totally transparent zone 320 can be, for example, 100%, and the light transmittance of the totally light-blocking zone 330 can be, for example, 0%. Prior to exposure, the projection of a border 312 of the GTM pattern zone 310 towards the substrate 100 is first aligned with a predetermined start line $X_{1s}$ of a first step $X_1$ of the first wall 121; the projection of a border 316 at the intersection of the GTM pattern zone 310 and the totally transparent zone 320 is aligned with a predetermined start line $X_{2s}$ of a second step $X_2$ of the first wall 121; and the projection of a border 332 at the intersection of the totally transparent zone 320 and the totally light-blocking zone 330 is aligned with predetermined end lines $Z_{1e}$ and $Z_{2e}$ of the first step $X_1$ and the second step $X_2$ of the first wall 121. Thereafter, an exposure process is performed.

Since the GTM pattern zone 310 is aligned with the first sidewall 122 (or referred to as the sidewall of the contact hole) of the first wall 121 during the exposure process, only a portion but not all of the photoresist will be washed away after development. However, since all of the pixel region 140 and the second sidewall 124 of the first wall 121 are aligned with the totally light-blocking zone 330 during the entire exposure process, the photoresist corresponding thereto does not undergo exposure and are washed away by a developer entirely, so that the photoresist at the pixel region 140 cannot be retained. Thereafter, a baking process is performed to reflow the photoresist, thereby forming the first sidewall 122 and the second sidewall 124 shown in FIG. 9C.

Figure 10A:
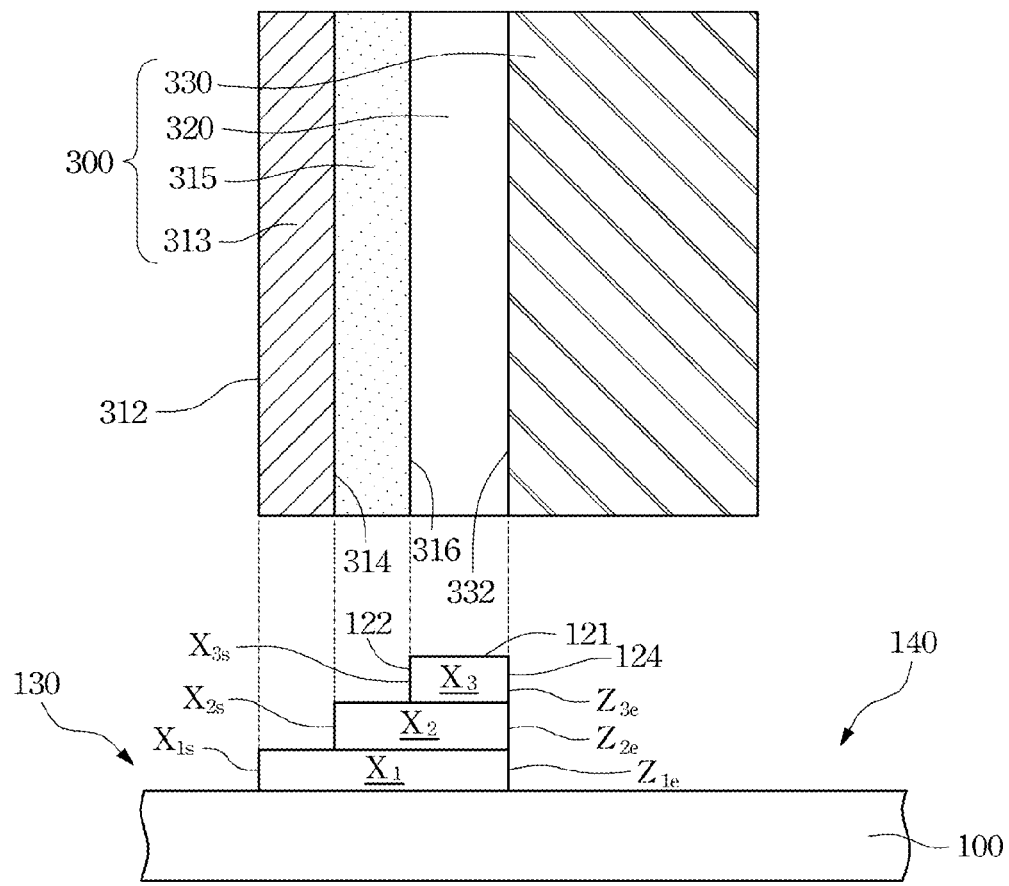
FIG. 10A to FIG. 10B are schematic views showing a patterning step according to another embodiment of the present invention.
Figure 10B:
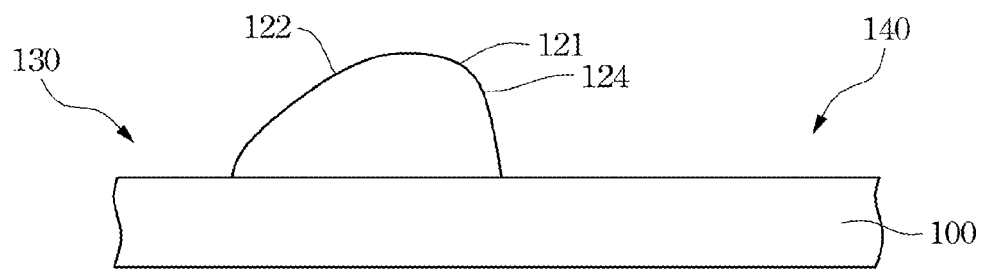

Besides the two-step stair structure, after exposure, the photoresist also may form a three-step stair structure. For example, as shown in FIG. 10A and FIG. 10B, the photomask 300 shown in FIG. 10A may include a first GTM pattern zone 313, a second GTM pattern zone 315, a totally transparent zone 320 and a totally light-blocking zone 330 arranged in sequence. A light transmittance of the first GTM pattern zone 313 can be ranged between 10% and 40% or preferably between 25% and 35%, for example. A light transmittance of the second GTM pattern zone 315 can be ranged between 40% and 80% or preferably between 50% and 70%, for example. The light transmittance of the totally transparent zone 320 can be, for example, 100%, and the light transmittance of the totally light-blocking zone 330 can be, for example, 0%. Prior to exposure, the projection of a border 312 of the first GTM pattern zone 313 towards the substrate 100 is first aligned with a predetermined start line $X_{1s}$ of a first step $X_1$ of the first wall 121; the projection of a border 314 at the intersection of the first GTM pattern zone 313 and the second GTM pattern zone 315 is aligned with a predetermined start line $X_{2s}$ of a second step $X_2$ of the first wall 121; the projection of a border 316 at the intersection of the second GTM pattern zone 315 and the totally transparent zone 320 is aligned with a predetermined start line $X_{3s}$ of a second step $X_3$ of the first wall 121; and the projection of a border 332 at the intersection of the totally transparent zone 320 and the totally light-blocking zone 330 is aligned with predetermined end lines $Z_{1e}$, $Z_{2e}$ and $Z_{3e}$ of the first step $X_1$, the second step $X_2$ and the third step $X_3$ of the first wall 121. Thereafter, an exposure process is performed.

Since the first GTM pattern zone 313 and the second GTM pattern zone 315 are aligned sequentially with the first sidewall 122 (or referred to as the sidewall of the contact hole) of the first wall 121 during the exposure process, the first sidewall 122 of the first wall 121 receives the influences of different exposure amounts, so that portions of the photoresist are washed away by a developer after development, thus showing a step shape. However, since all of the pixel region 140 and the second sidewall 124 of the first wall 121 are aligned with the totally light-blocking zone 330 during the entire exposure process, the photoresist corresponding thereto does not undergo exposure and are washed away by a developer entirely, so that the photoresist at the pixel region 140 cannot be retained. Thereafter, a baking process is performed to reflow the photoresist, thereby forming the first sidewall 122 and the second sidewall 124 shown in FIG. 10C.

Further, there are other designs used for controlling exposure intensities, so as to achieve the efficacy of forming a wall with two different sidewall slopes. In other embodiments, a HTM can be used to perform exposure on the sidewall, which also can make the slope of the first sidewall 122 of the wall 121 gentler than that of the second sidewall 124, i.e. the sidewall slope of the contact hole is gentler than the sidewall slope at the pixel region.

Figure 11A:
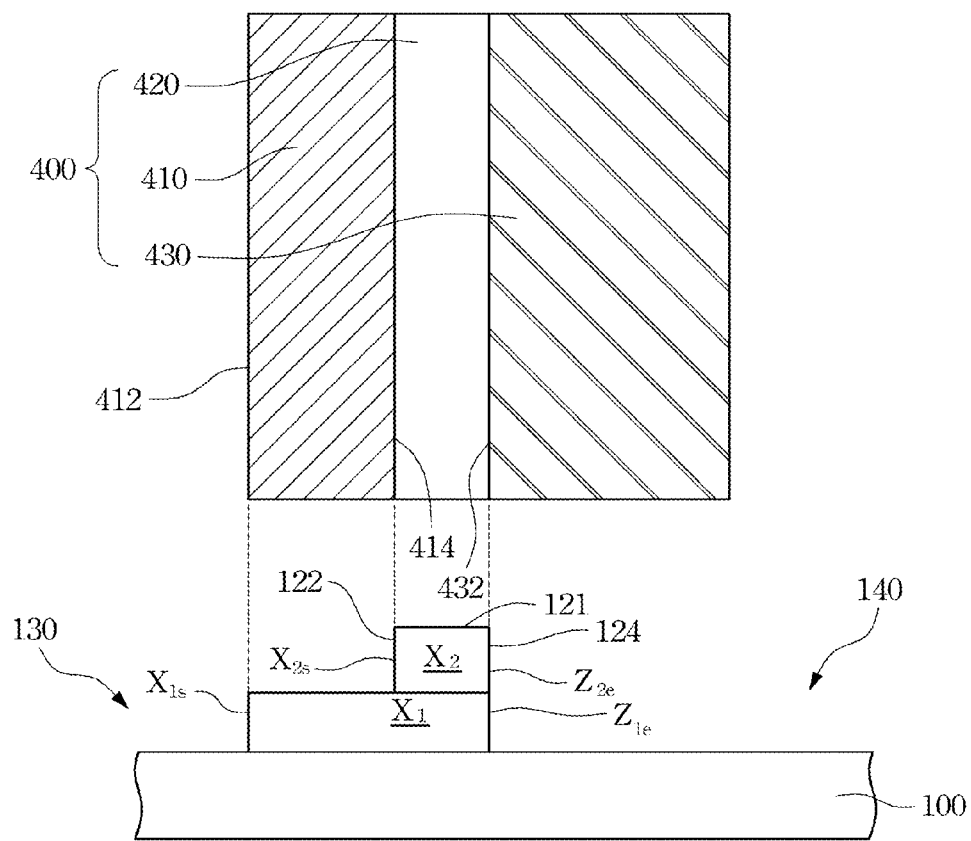
FIG. 11A to FIG. 11B are schematic views showing a patterning step according to another embodiment of the present invention.
Figure 11B:
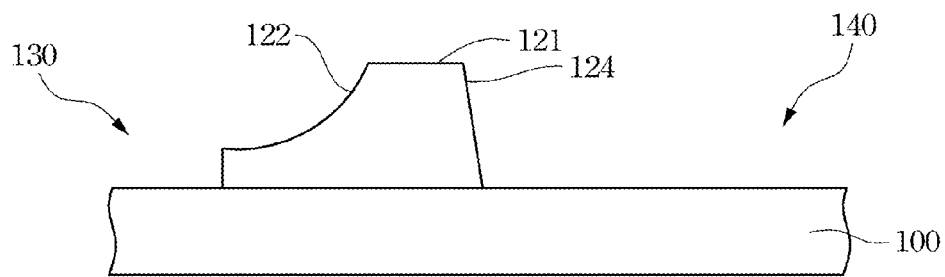

Using a two-step stair structure formed by the photoresist after exposure as an example, a photomask 400 shown in FIG. 11A may include a HTM pattern zone 410, a totally transparent zone 420 and a totally light-blocking zone 430 arranged in sequence. The light transmittance of the HTM pattern zone 410 can be determined in accordance with actual needs, and the light transmittance of the totally transparent zone 420 can be, for example, 100%, and the light transmittance of the totally light-blocking zone 430 can be, for example, 0%. Prior to exposure, the projection of a border 412 of the HTM pattern zone 410 towards the substrate 100 is first aligned with a predetermined start line $X_{1s}$ of a first step $X_1$ of the first wall 121; the projection of a border 414 at the intersection of the HTM pattern zone 410 and the totally transparent zone 420 is aligned with a predetermined start line $X_{2s}$ of a second step $X_2$ of the first wall 121; and the projection of a border 432 at the intersection of the totally transparent zone 420 and the totally light-blocking zone 430 is aligned with predetermined end lines $Z_{1e}$ and $Z_{2e}$ of the first step $X_1$ and the second step $X_2$ of the first wall 121. Thereafter, an exposure process is performed.

Similarly, since the HTM pattern zone 410 is aligned with the first sidewall 122 (or referred to as the sidewall of the contact hole) of the first wall 121 during the exposure process, only a portion but not all of the photoresist will be washed away after development. However, since all of the pixel region 140 and the second sidewall 124 of the first wall 121 are aligned with the totally light-blocking zone 430 during the entire exposure process, the photoresist corresponding thereto does not undergo exposure and are washed away by a developer entirely, so that the photoresist at the pixel region 140 cannot be retained. Thereafter, a baking process is performed to reflow the photoresist, thereby forming the first sidewall 122 and the second sidewall 124 shown in FIG. 11B.

Figure 12A:
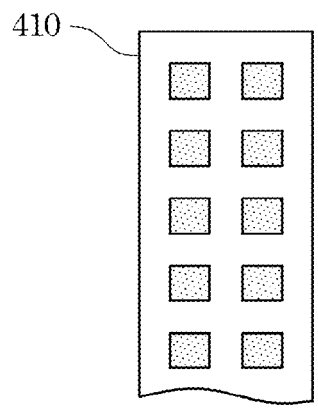
FIG. 12A to FIG. 12F are schematic top views showing a half-tone mask (HTM) according to the embodiment of the present invention.
Figure 12B:
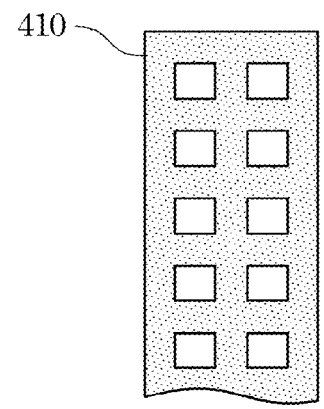
Figure 12C:
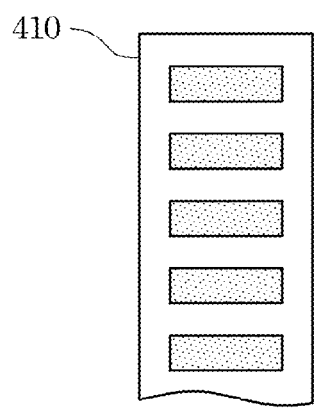
Figure 12D:
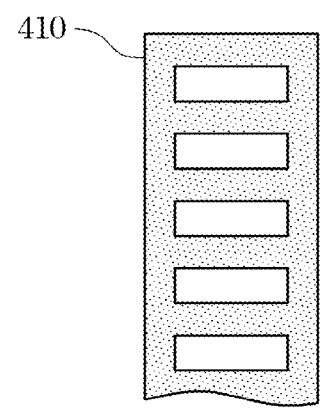
Figure 12E:
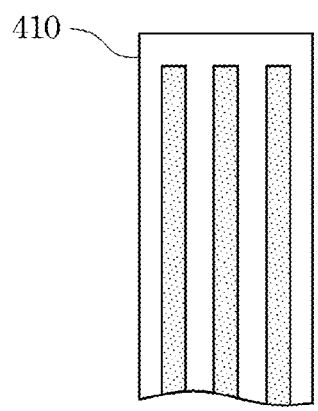
Figure 12F:
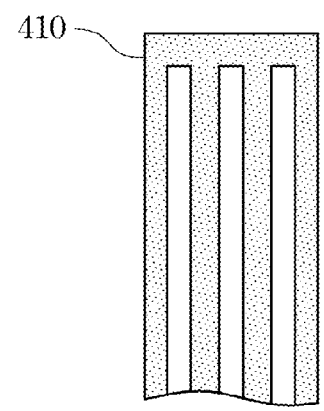

The aforementioned HTM pattern zone 410 can be designed in accordance with actual needs. For example, the HTM pattern zone 410 can be designed as a dot/mash type arrangement, as shown in FIG. 12A and FIG. 12B, wherein dotted areas stand for light-blocking areas (their light-transmittances are 0%), and vacant areas stand for transparent areas (their light-transmittances are 100%). Certainly, the HTM pattern zone 410 can be designed as a slit/line type arrangement, as shown in FIG. 12C, FIG. 12D, FIG. 12E and FIG. 12F, wherein dotted areas stand for light-blocking areas (their light-transmittances are 0%), and vacant areas stand for transparent areas (their light-transmittances are 100%).

The material forming the aforementioned wall can be a photosensitive resin containing a black pigment, wherein the black pigment can be such as carbon black, titanium black, lead black, metal oxide, iron oxide or titanium oxide. As to other process parameters related to patterning the wall, they should be varied in accordance with the composition of the photosensitive resin. In the present embodiment, an exposure amount for patterning the wall can be ranged between 30 mJ/cm$^2$ and 1000 mJ/cm$^2$; or 30 mJ/cm$^2$ and 100 mJ/cm$^2$, and an illumination intensity therefore can be ranged between 20 mW/cm$^2$ and 60 mW/cm$^2$, and an exposure time therefore can be ranged between 0.5 sec and 50 sec. It should be understood that the aforementioned process parameters are merely stated as an example, and the material forming the wall also can be a conductive material such as copper, molybdenum; or a non-conductive material such as a resin material, but the embodiments of the present invention are not limited thereto. One of ordinary skill in the art should flexibly choose the material for forming the wall in accordance with actual needs.

Please return to FIG. 3. After the wall 120 is patterned, a step is performed for ink-jet printing (IJP) at least one color resist 150 into the pixel region 140. In other words, after the step is performed, the color resist 150 is filled in the pixel region 140 to provide the required filtering function.

Figure 4:
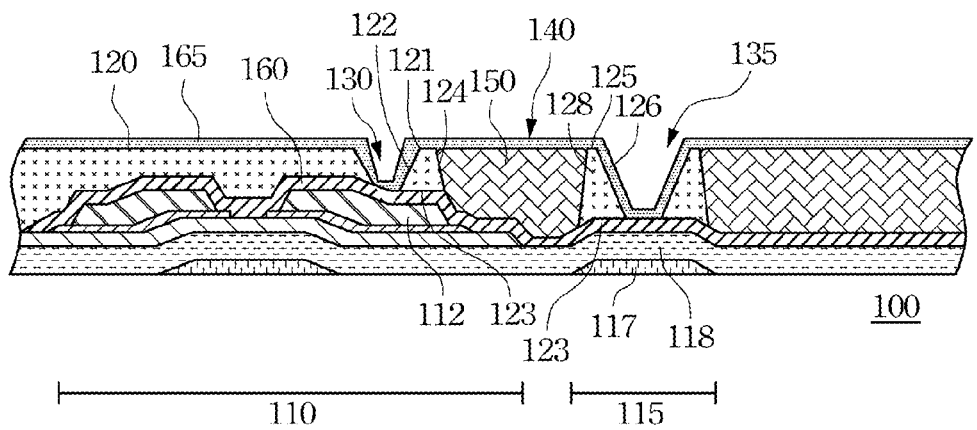

Referring to FIG. 4, then, a second protection layer 165 can be formed on the substrate 100. The second protection layer 165 may cover the entire structure currently formed on the substrate 100 (for example, the color resist 150 and the wall 120), thereby preventing the structure from being affected by the subsequent processes.

The material forming the aforementioned first and second protection layers 160 and 165 can be (include but not limited): organic layers, silicon nitride, silicon oxide or another suitable protection material. Further, the aforementioned first and second protection layers 160 and 165 are necessary elements, and one of ordinary skill in the art should flexibly choose if it is necessary to form the first and second protection layers 160 and 165 in accordance with actual needs.

Figure 5:
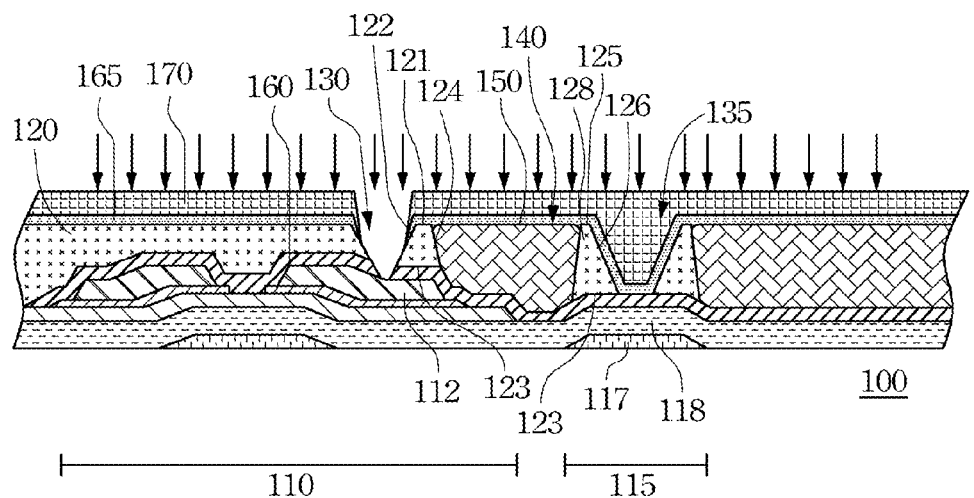

Referring to FIG. 5, then, a lithographic etching can be used to remove the first and second protection layers 160 and 165 in the first contact hole 130, thereby enabling a transparent electrode 180 subsequently formed to electrically connect to a drain electrode 112 of the TFT 110. Detailedly speaking, a photoresist 170 is first formed on the substrate 110, and then an etching process is used to remove the first and second protection layers 160 and 165 in the first contact hole 130. After the first and second protection layers 160 and 165 are removed from the first contact hole 130, the photoresist 170 can be optionally removed, thereby benefiting the subsequent processes.

Figure 6:
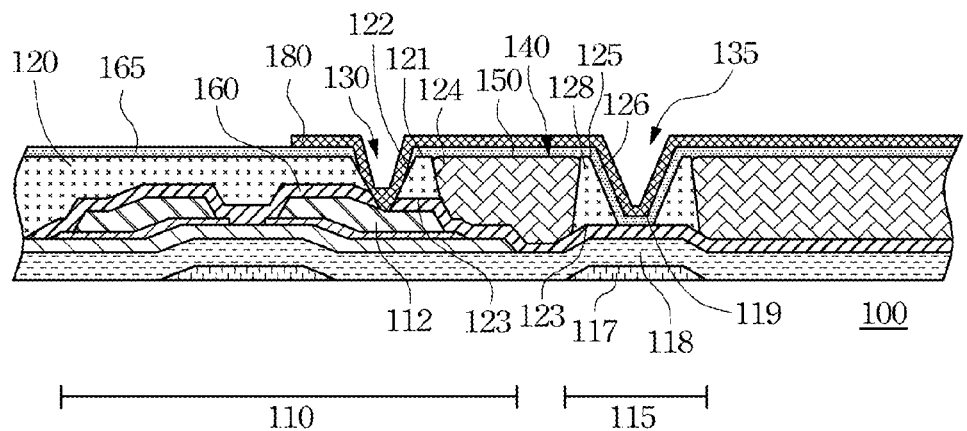

Referring to FIG. 6, then, the transparent electrode 180 can be formed on the substrate 100 to cover the wall 120, the first contact hole 130, the second contact hole 135 and the color resist 150. Detailedly speaking, the aforementioned transparent electrode 180 can be electrically connected to the drain electrode 112 of the TFT 110 via the first contact hole 130. Further, the transparent electrode 180 also may be extended to the dielectric layer 118 of the capacitor 115 via the second hole 135 and used as an upper electrode 119 of the capacitor 115.

Another technical aspect of the present invention is the TFT array made by using the aforementioned manufacturing method. As shown in FIG. 6, a TFT array includes the substrate 100, the TFT 110, the first wall 121, the transparent electrode 180 and the color resist 150. The TFT is disposed on the substrate 100. The first wall 121 is disposed on the substrate 100, and at least separates the first contact hole 130 from the pixel region 140 on the substrate 100, wherein the drain electrode 112 of the TFT 110 is exposed through the first contact hole 130. The first wall 121 includes the first sidewall 122 facing towards the first contact hole 130 and the second sidewall 124 facing towards the pixel region 140, wherein the slope of the first sidewall 122 is gentler than that of the second sidewall 124. The transparent electrode 180 is electrically connected to the drain electrode 112 of the TFT 110 via the first contact hole 130. The color resist 150 is filled in the pixel region 140.

Further, the TFT array shown in FIG. 6 further includes the capacitor 115 and the second wall 125. The capacitor 115 is disposed on the substrate 100, and includes the lower electrode 117, the dielectric layer 118 and the upper electrode 119, wherein the dielectric layer 118 is disposed between the lower electrode 117 and the upper electrode 119. The second wall 125 is disposed on the substrate 100, and separates the pixel region 140 from the second contact hole 135, wherein the dielectric layer 118 of the capacitor 115 is exposed through the contact hole 135, and the transparent electrode 180 is extended to the dielectric layer 118 of the capacitor 115 via the second contact hole 135 and used as an upper electrode 119 of the capacitor 115. The second wall 125 includes the first sidewall 126 facing towards the second contact hole 135 and the second wall 128 facing towards the pixel region 140, wherein the slope of the first sidewall 126 is gentler than that of the second sidewall 128.

With respect to the first wall 121, a difference between the slope of the first sidewall 122 and that of the second sidewall 124 can be ranged between 10° and 60° or between 10° and 30°. Similarly, with respect to the second wall 125, a difference between the slope of the first sidewall 126 and that of the second sidewall 128 also can be ranged between 10° and 60° or between 10° and 30°.

Further, with respect to the first wall 121, the slope of the first sidewall 122 is preferably ranged between 10° and 70° or between 20° and 60°, and the slope of the second sidewall 124 is preferably ranged between 70° and 100° or between 70° and 90°. Similarly, with respect to the second wall 125, the slope of the first sidewall 126 is preferably between 10° and 70° or between 20° and 60°, and the slope of the second sidewall 128 is preferably ranged between 70° and 100° or between 70° and 90°.

Further, in the embodiments of the present invention, when the wall is being patterned, the photomask and the substrate can be moved independently in a horizontal direction, or both can be moved at simultaneously in the same or opposite horizontal directions, thereby making the sidewall slope of the contact hole gentler than the sidewall slope at the pixel region. However, the embodiments of the present invention are not limited thereto.

It should be understood that the aforementioned slope values are merely stated as examples, and are not used to limit the embodiments of the present invention. One of ordinary skill in the art should flexibly choose the slope values of the first and second sidewalls in accordance with actual needs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor (TFT) array substrate, comprising:
   a substrate;
   at least one thin film transistor disposed on the substrate;
   a first wall which is disposed above the thin film transistor on the substrate and at least separates a first contact hole from a pixel region on the substrate, wherein the first contact hole exposes a drain electrode of the thin film transistor, the first wall comprising:
   at least one first sidewall facing towards the first contact hole, the first sidewall having a first slope; and
   at least one second sidewall facing towards the pixel region, the second sidewall having a second slope, wherein the first slope is gentler than the second slope;
   a color resist filled in the pixel region; and
   a transparent electrode disposed above the color resist and electrically connected to the drain electrode of the thin film transistor through the first contact hole.

2. The thin film transistor array substrate as claimed in claim 1, further comprising:
   a capacitor disposed on the substrate, the capacitor comprising a lower electrode, a dielectric layer and an upper electrode, wherein the dielectric layer is disposed between the lower electrode and the upper electrode; and
   a second wall which is disposed above the capacitor on the substrate and separates a second contact hole from the pixel region on the substrate, wherein the second contact hole exposes the dielectric layer of the capacitor, and the transparent electrode is extended to the dielectric layer of the capacitor through the second contact hole and used as the upper electrode of the capacitor, the second wall comprising:

at least one third sidewall facing towards the second contact hole, the third sidewall having a third slope; and at least one fourth sidewall facing towards the pixel region, the fourth sidewall having a fourth slope, wherein the third slope is gentler than the fourth slope.

3. The thin film transistor array substrate as claimed in claim 1, wherein a difference between the first slope and the second slope is ranged between 10° and 60°.

4. The thin film transistor array substrate as claimed in claim 1, wherein a difference between the first slope and the second slope is ranged between 10° and 30°.

5. The thin film transistor array substrate as claimed in claim 1, wherein the first slope is ranged between 10° and 70°.

6. The thin film transistor array substrate as claimed in claim 1, wherein the second slope is ranged between 70° and 100°.

7. A thin film transistor (TFT) array substrate, comprising:
a substrate;
at least one thin film transistor disposed on the substrate;
a color resist disposed on the substrate;
a first wall which is disposed above the thin film transistor on the substrate and at least separates a first contact hole from the color resist, wherein the first contact hole exposes a drain electrode of the thin film transistor, the first wall comprising:
at least one first sidewall facing towards the first contact hole, the first sidewall having a first slope; and
at least one second sidewall facing towards the color resist, the second sidewall having a second slope, wherein the first slope is gentler than the second slope, and at least one portion of the color resist is in direct contact with the second sidewall; and
a transparent electrode electrically connected to the drain electrode of the thin film transistor through the first contact hole.

8. The thin film transistor array substrate as claimed in claim 7, further comprising:
a capacitor disposed on the substrate, the capacitor comprising a lower electrode, a dielectric layer and an upper electrode, wherein the dielectric layer is disposed between the lower electrode and the upper electrode; and
a second wall which is disposed above the capacitor on the substrate and separates a second contact hole from the color resist, wherein the second contact hole exposes the dielectric layer of the capacitor, and the transparent electrode is extended to the dielectric layer of the capacitor through the second contact hole and used as the upper electrode of the capacitor, the second wall comprising:

at least one third sidewall facing towards the second contact hole, the third sidewall having a third slope; and at least one fourth sidewall facing towards the color resist, the fourth sidewall having a fourth slope, wherein the third slope is gentler than the fourth slope.

9. The thin film transistor array substrate as claimed in claim 7, wherein a difference between the first slope and the second slope is ranged between 10° and 60°.

10. The thin film transistor array substrate as claimed in claim 7, wherein a difference between the first slope and the second slope is ranged between 10° and 30°.

11. The thin film transistor array substrate as claimed in claim 7, wherein the first slope is ranged between 10° and 70°.

12. The thin film transistor array substrate as claimed in claim 7, wherein the second slope is ranged between 70° and 100°.

13. The thin film transistor array substrate as claimed in claim 1, wherein the first wall is made of an organic or inorganic material with hydrophobic or lipophilic properties.

14. The thin film transistor array substrate as claimed in claim 1, wherein the first wall comprises a photosensitive resin containing a black pigment.

15. The thin film transistor array substrate as claimed in claim 2, wherein the second wall is made of an organic or inorganic material with hydrophobic or lipophilic properties.

16. The thin film transistor array substrate as claimed in claim 2, wherein the second wall comprises a photosensitive resin containing a black pigment.

17. The thin film transistor array substrate as claimed in claim 7, wherein the first wall is made of an organic or inorganic material with hydrophobic or lipophilic properties.

18. The thin film transistor array substrate as claimed in claim 7, wherein the first wall comprises a photosensitive resin containing a black pigment.

19. The thin film transistor array substrate as claimed in claim 8, wherein the second wall is made of an organic or inorganic material with hydrophobic or lipophilic properties.

20. The thin film transistor array substrate as claimed in claim 8, wherein the second wall comprises a photosensitive resin containing a black pigment.

* * * * *